（12） United States Patent
Fried et al.

(10) Patent No.: US 8,120,138 B2
(45) Date of Patent: Feb. 21, 2012

(54) HIGH-Z STRUCTURE AND METHOD FOR CO-ALIGNMENT OF MIXED OPTICAL AND ELECTRON BEAM LITHOGRAPHIC FABRICATION LEVELS

(75) Inventors: David Michael Fried, Hopewell Junction, NY (US); John Michael Hergenrother, Ridgefield, CT (US); Sharee Jane McNab, Christchurch (NZ); Michael J. Rooks, Briarcliff Manor, NY (US); Anna Topol, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 12/436,189

(22) Filed: May 6, 2009

(65) Prior Publication Data

US 2009/0212388 A1   Aug. 27, 2009

Related U.S. Application Data

(62) Division of application No. 11/618,974, filed on Jan. 2, 2007, now Pat. No. 7,696,057.

(51) Int. Cl.
*H01L 23/544* (2006.01)
(52) U.S. Cl. .................................. 257/506; 257/E21.54
(58) Field of Classification Search .................. 257/506, 257/E21.54, E23.179, 797, 347; 438/401; 430/296
See application file for complete search history.

(56) References Cited

U.S. PATENT DOCUMENTS

| 6,541,182 | B1 | 4/2003 | Dogue et al. |
| 6,586,334 | B2 | 7/2003 | Jiang |
| 6,864,151 | B2 * | 3/2005 | Yan et al. ...................... 438/424 |
| 6,977,128 | B2 | 12/2005 | Boulin et al. |
| 2002/0009874 | A1 * | 1/2002 | Farrar et al. ................... 438/620 |
| 2002/0102790 | A1 * | 8/2002 | Kim ............................... 438/239 |
| 2004/0114143 | A1 | 6/2004 | Van Haren et al. |
| 2006/0177979 | A1 | 8/2006 | Tu |
| 2007/0049015 | A1 * | 3/2007 | Nejad et al. ................... 438/649 |
| 2007/0090456 | A1 * | 4/2007 | Lee ................................ 257/347 |
| 2007/0259500 | A1 * | 11/2007 | Cheng et al. .................. 438/272 |
| 2008/0061322 | A1 * | 3/2008 | von Kluge .................... 257/213 |

OTHER PUBLICATIONS

Office Action (Mail Date Aug. 19, 2009) for U.S. Appl. No. 11/618,974, filed Jan. 2, 2007, Confirmation No. 6730.
Notice of Allowance (Mail Date Nov. 27, 2009) for U.S. Appl. No. 11/618,974, filed Jan. 2, 2007, Confirmation No. 6730.

\* cited by examiner

*Primary Examiner* — Evan Pert
*Assistant Examiner* — Selim Ahmed
(74) *Attorney, Agent, or Firm* — Schmeiser, Olsen & Watts; Louis J. Percello

(57) ABSTRACT

A structure for aligning a first set of features of a fabrication level of an integrated circuit chip to an electron beam alignment target. The structure including a first trench in a semiconductor substrate, the first trench extending from a top surface of the substrate into the substrate a first distance; an electron back-scattering layer in a bottom of the first trench; a dielectric capping layer in the trench over the back-scattering layer; and a second trench in the substrate, the second trench extending from the top surface of the substrate into the substrate a second distance, the second distance less than the first distance.

30 Claims, 8 Drawing Sheets

HIGH-Z STRUCTURE AND METHOD FOR CO-ALIGNMENT OF MIXED OPTICAL AND ELECTRON BEAM LITHOGRAPHIC FABRICATION LEVELS

This Application is a division of copending U.S. patent application Ser. No. 11/618,974 filed on Jan. 2, 2007.

FIELD OF THE INVENTION

The present invention relates to the field of semiconductor processing; more specifically, it relates to an alignment target and a method for co-alignment of mixed optical and electron beam lithographic fabrication levels.

BACKGROUND OF THE INVENTION

In order to fabricate an integrated circuit the various lithographically defined fabrications levels must be aligned to each other. In optical lithography, a layer of photoresist on a substrate is exposed to actinic radiation through a patterned photomask that is aligned to an alignment target on the substrate. Structures fabricated in earlier lithographic fabrication steps serve as these alignment targets for alignment marks on the photomasks. Electron beam lithography, by contrast is a direct-write process, there are no photomasks and the electron beam is scanned across an electron beam resist layer. For each fabrication level, the electron beam must be registered to a reference structure. In general, optical lithography is fast but cannot print images on very small pitches. Electron beam lithography can print images on very small pitches, but is slow. The benefits derivable from merging of these two technologies is hindered by the fact that electron beam lithographic systems cannot register to current optical alignment structures. Therefore, there is a need for an alignment target and method for co-alignment of optical and electron beam lithographic fabrication levels.

SUMMARY OF THE INVENTION

A first aspect of the present invention is a method, comprising: forming an electron beam alignment target in a substrate, the electron beam alignment target comprising an electron back-scattering layer in a bottom of a trench and a capping layer on top of the electron back-scattering layer and filling the trench; forming an optical alignment target in the substrate after forming the electron beam alignment target, the optical alignment target positioned in a predetermined location in the substrate relative to a location of the electron beam alignment target in the substrate; forming a resist layer on the substrate; aligning a photomask to either the optical alignment target or to the electron beam alignment target, the photomask having a first pattern of clear and opaque regions representing a first set of features of a fabrication level of an integrated circuit; exposing the resist layer to actinic radiation through the photomask to form optically exposed regions in the resist layer, the opaque regions substantially blocking the actinic radiation and the clear regions substantially transmitting the actinic radiation; locating a home position of an electron beam relative to the location of the electron beam alignment target; exposing the resist to the electron beam in a second pattern to form electron beam exposed regions in the resist layer, the second pattern representing a second set of the features of the fabrication level of the integrated circuit; and developing the resist layer to transfer the first and second patterns to a resist pattern in the resist layer.

A second aspect of the present invention the first aspect, wherein the electron backscattering layer comprises a metal.

A third aspect of the present invention is the first aspect, wherein the electron beam alignment target further includes a stress reduction layer between the electron backscattering layer and the capping layer.

A fourth aspect of the present invention is the third aspect wherein the electron backscattering layer comprises a metal and the stress reduction layer comprises a metal silicide.

A fifth aspect of the present invention is the first aspect further including: transferring the resist pattern into the substrate or into a layer formed on the substrate.

A sixth aspect of the present invention is the first aspect wherein the step of aligning the photomask to either the optical alignment target or to the electron beam alignment target includes positioning an alignment mark on the photomask with respect to either the optical alignment target or to the electron beam alignment target, respectively.

A seventh aspect of the present invention is the first aspect wherein: (i) the exposing the resist layer to actinic radiation is performed before the exposing the resist layer to the electron beam; or (ii) the exposing the resist layer to the electron beam is performed before the exposing the resist layer to actinic radiation.

An eighth aspect of the present invention is the first aspect further including: dividing the surface of the substrate into virtual electron beam exposure fields; and forming additional electron beam alignment targets only within each region of the substrate that contains features that are members of the second set of features and have locations on the substrate that correspond to locations within the virtual electron beam exposure fields.

A ninth aspect of the present invention is the first aspect, wherein an area measured along a top surface of the substrate taken up by the electron beam alignment target is from 25 to 100 times an area measured along the top surface of the substrate taken up by the optical alignment target.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
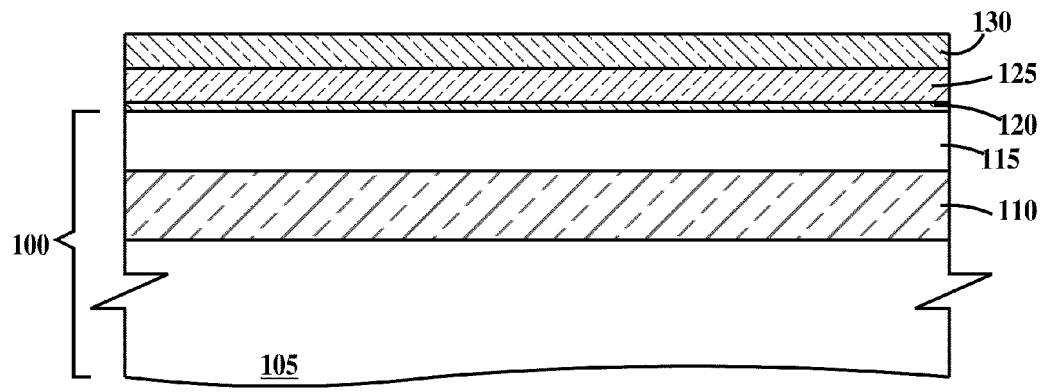
FIGS. 1A through 1P are cross-sectional drawings illustrating fabrication of an electron beam alignment target, an optical alignment target and an exemplary field effect transistor on the same substrate according to embodiments of the present invention.

Lithographic alignment is defined as the process of positioning different structures of an integrated circuit in horizontal directions (e.g. x-y position) with respect to each other and to a substrate on which the integrated circuit is being formed. A horizontal direction is defined as any direction parallel to the top surface of the substrate. A fabrication level of an integrated circuit is defined as a level that images a group of related patterned structures of the integrated circuit that are to be formed simultaneously in or on the substrate. A fabrication level may include two or more lithographic steps.

Optical lithography (herein after photolithography) forms a pattern of resist features and spaces in a resist layer by exposure of the resist layer to actinic radiation (e.g. ultraviolet light) through a photomask having a corresponding pattern of clear and opaque (to the actinic radiation) regions. Photolithographic alignment relies on positioning an image of an alignment mark on a photomask to an image of an alignment target on a substrate and moving either the photomask relative to the substrate or the substrate relative to the photomask in order to align the photomask (and the pattern on the mask) to the substrate (and structures on the substrate). Optical alignment targets have small horizontal dimensions (e.g. in the order of about 10 nm to about 100 nm, of limited depth (e.g. in the order of about 30 nm t to about 100 nm deep, and fabricated structures with low atomic weight (e.g. silicon).

Electron-beam lithography forms an image in a resist layer (with electron beam radiation) on a substrate by turning an electron beam off and on as the electron beam is scanned across the resist layer in a direct write process. Electron beam lithography alignment relies on locating a position on a substrate by imaging back-scattered electrons with scanning electron microscopy (SEM) relative to a home position of the electron beam in the electron beam exposure tool. The x-y location on the substrate directly in the path of the electron beam at any given time can then be determined. Electron beam alignment targets according to the embodiments of the present invention present a large topographical contrast (are large and deep) to the surrounding substrate area to increase the number of backscatter electrons that are used to generate a SEM image used to register the electron beam.

A photoresist is defined as a polymeric composition that is undergoes a chemical reaction changing its solubility in a developer when exposed to actinic ultraviolet radiation. An electron beam resist is defined as a polymeric composition that undergoes a chemical reaction changing its solubility in a developer when exposed to an electron beam. Resist is defined as a polymeric composition that undergoes a chemical reaction changing its solubility in a developer when exposed to actinic ultraviolet radiation or to an electron beam. Whenever a photoresist or electron beam resist is specified infra, a resist may be substituted.

While the embodiments of the present invention will be illustrated using a silicon-on-insulator (SOI) substrate, the embodiments of the present invention may be equally applied to bulk silicon substrates. Bulk silicon substrates do not include a buried oxide (BOX) layer. A common name for semiconductor substrates, bulk silicon or SOI, in the industry is "wafer" and the two terms substrate and wafer are used interchangeably in the industry. The terms integrated circuit and integrated circuit chip may be used interchangeably.

Figure 1B:
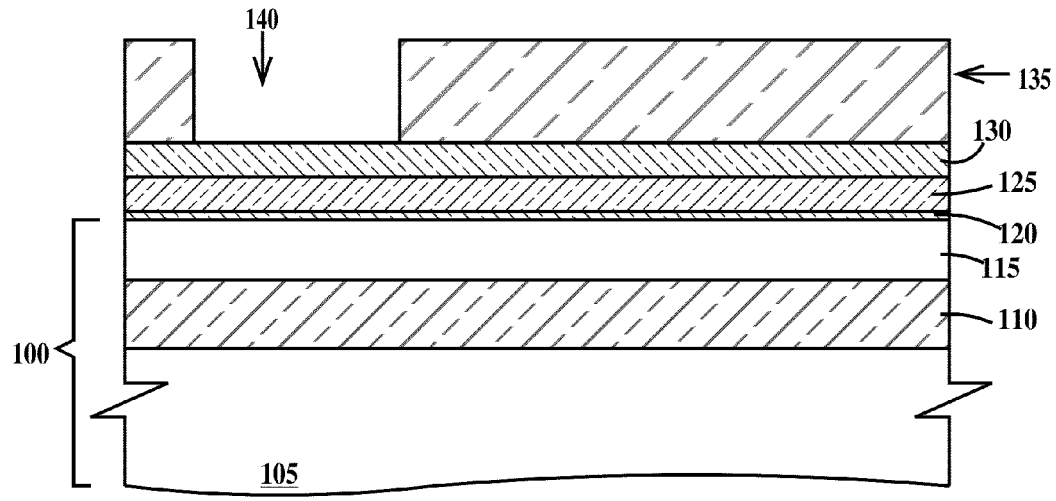
Figure 1C:
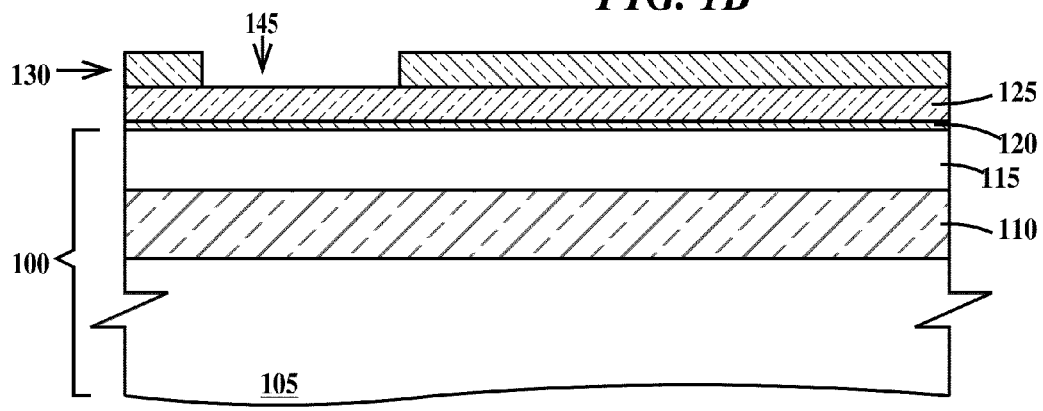
Figure 1D:
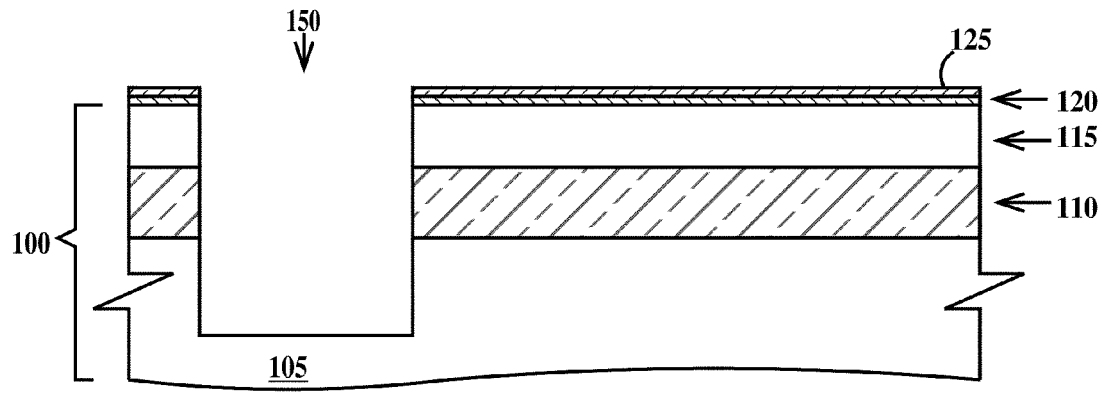
Figure 1E:
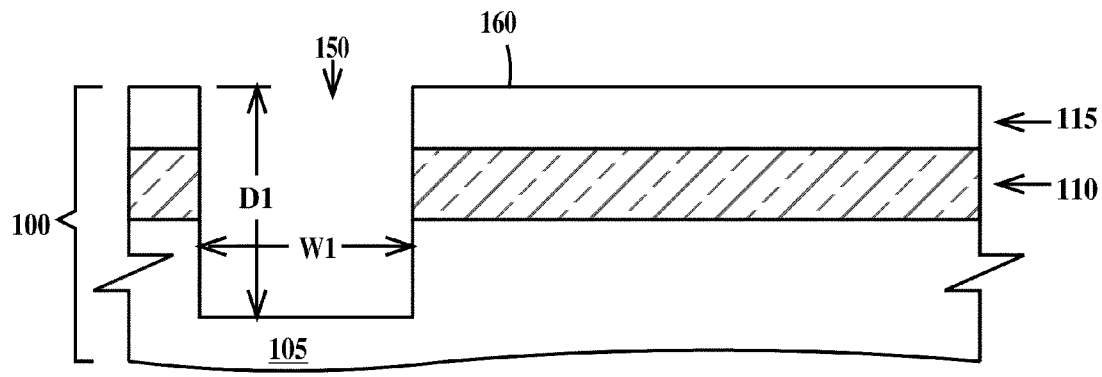
Figure 1F:
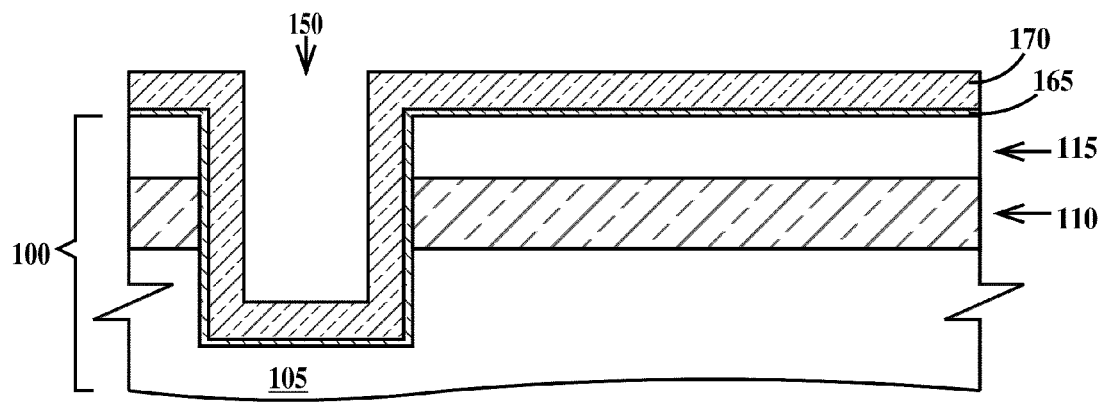
Figure 1G:
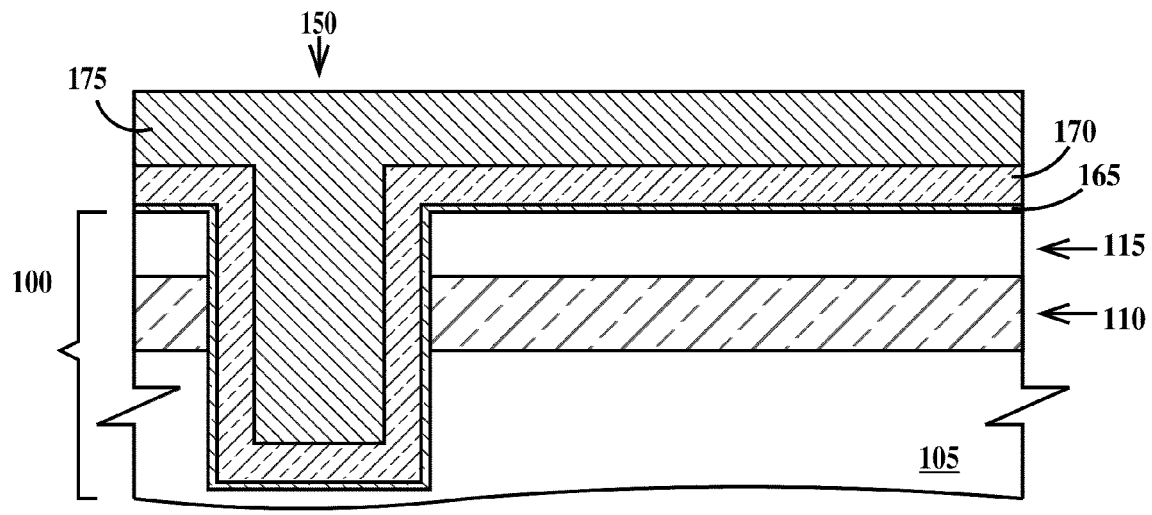
Figure 1H:
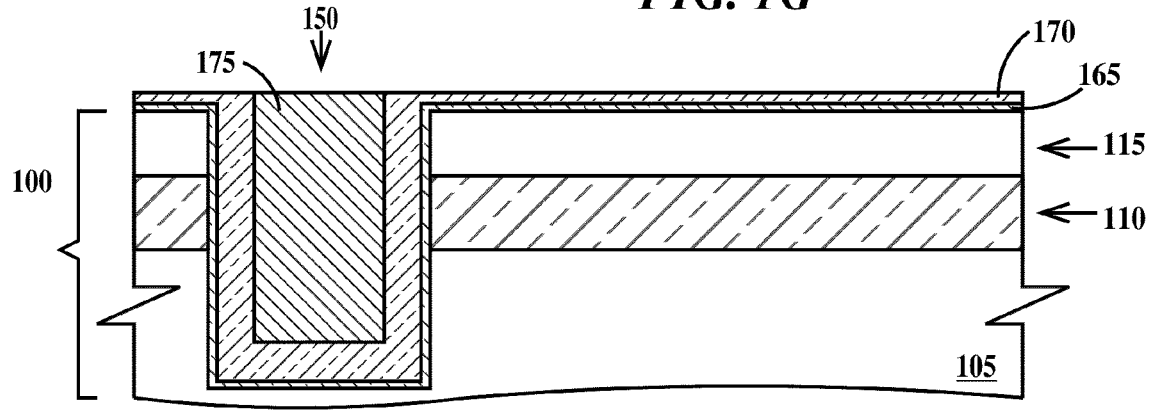
Figure 1I:
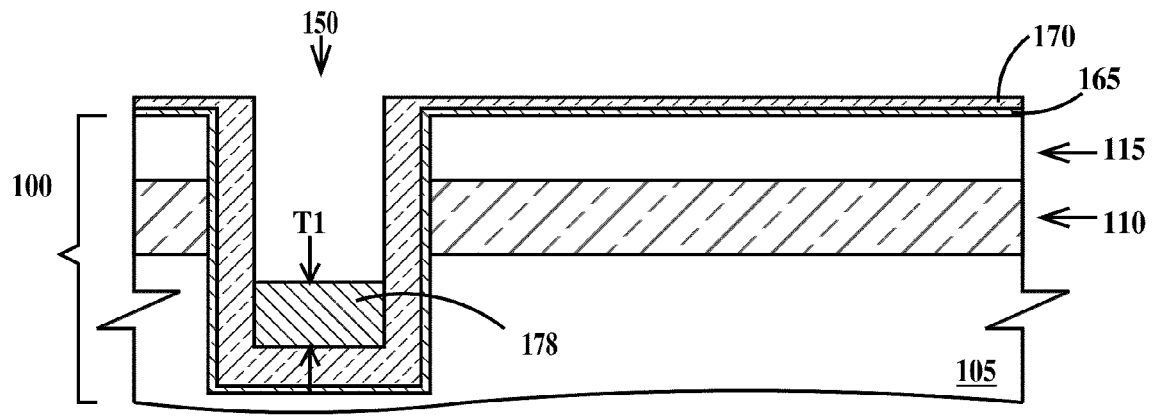
Figure 1J:
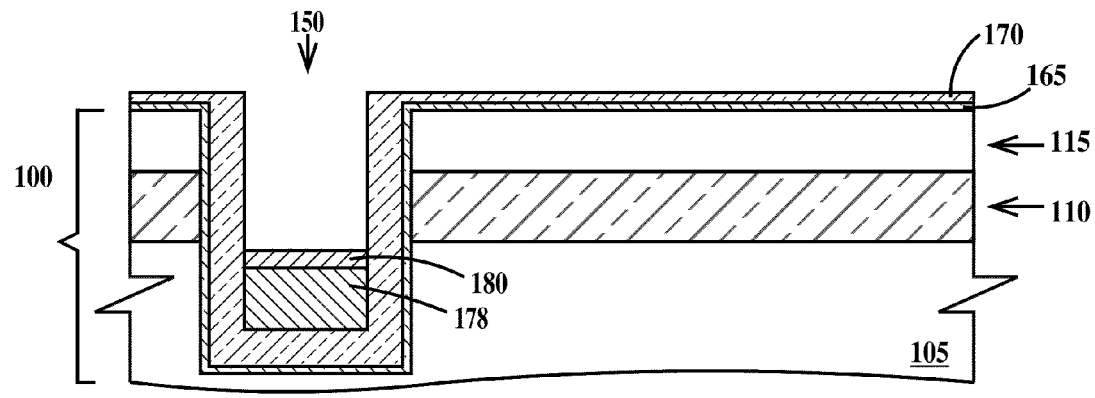
Figure 1K:
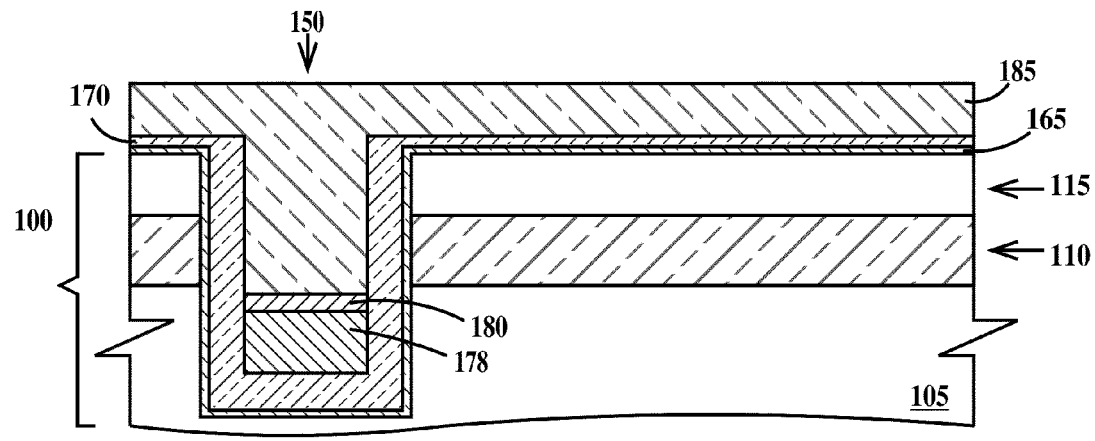
Figure 1L:
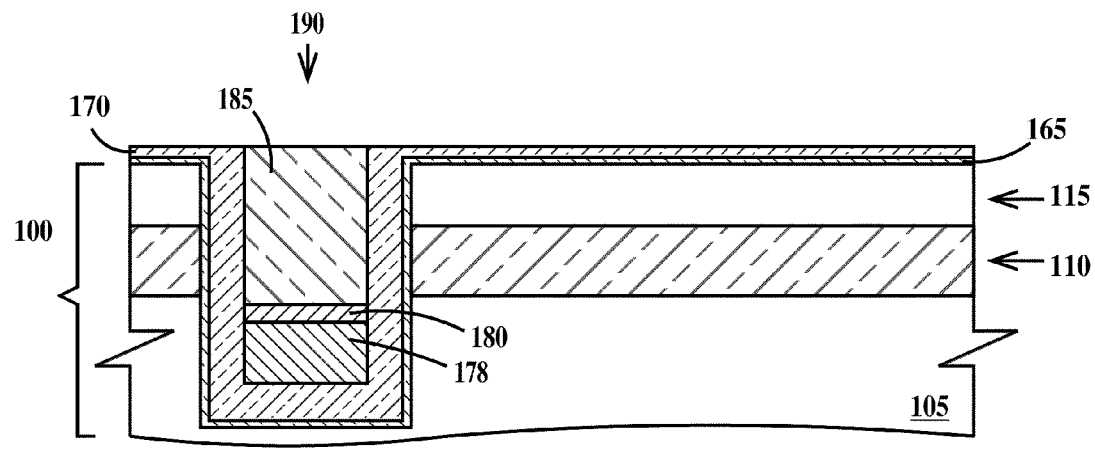
Figure 1M:
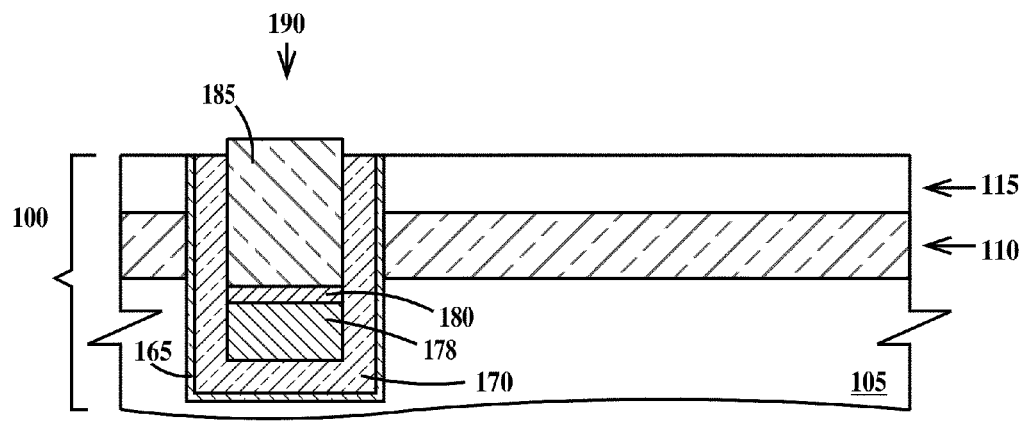
Figure 1N:
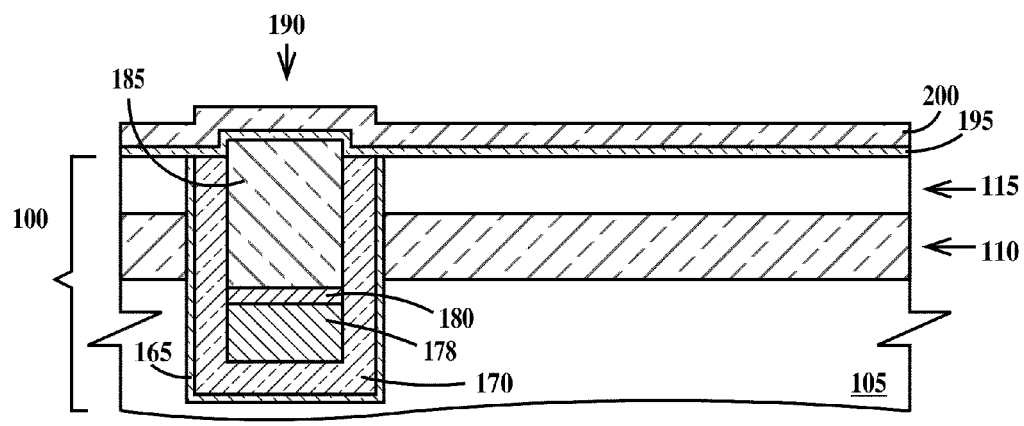
Figure 1O:
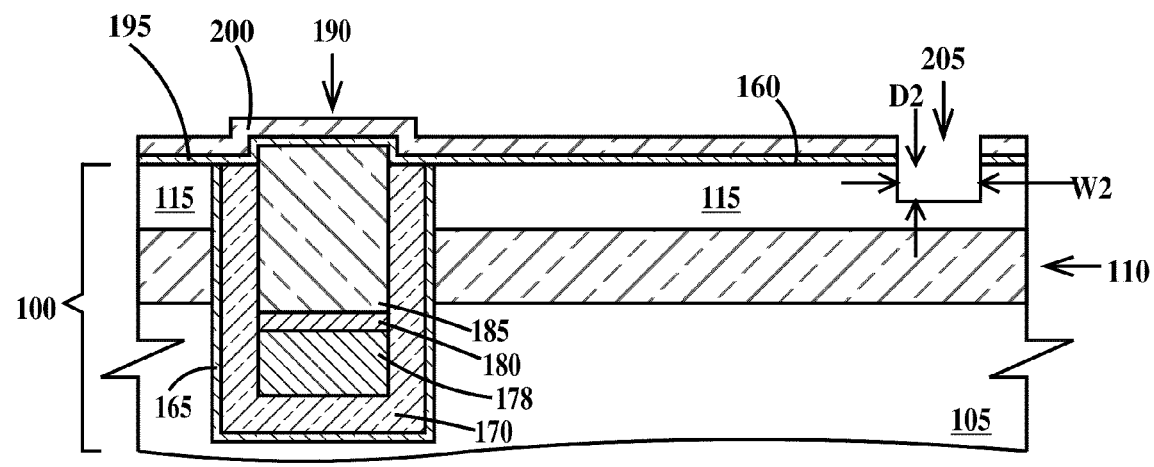
Figure 1P:
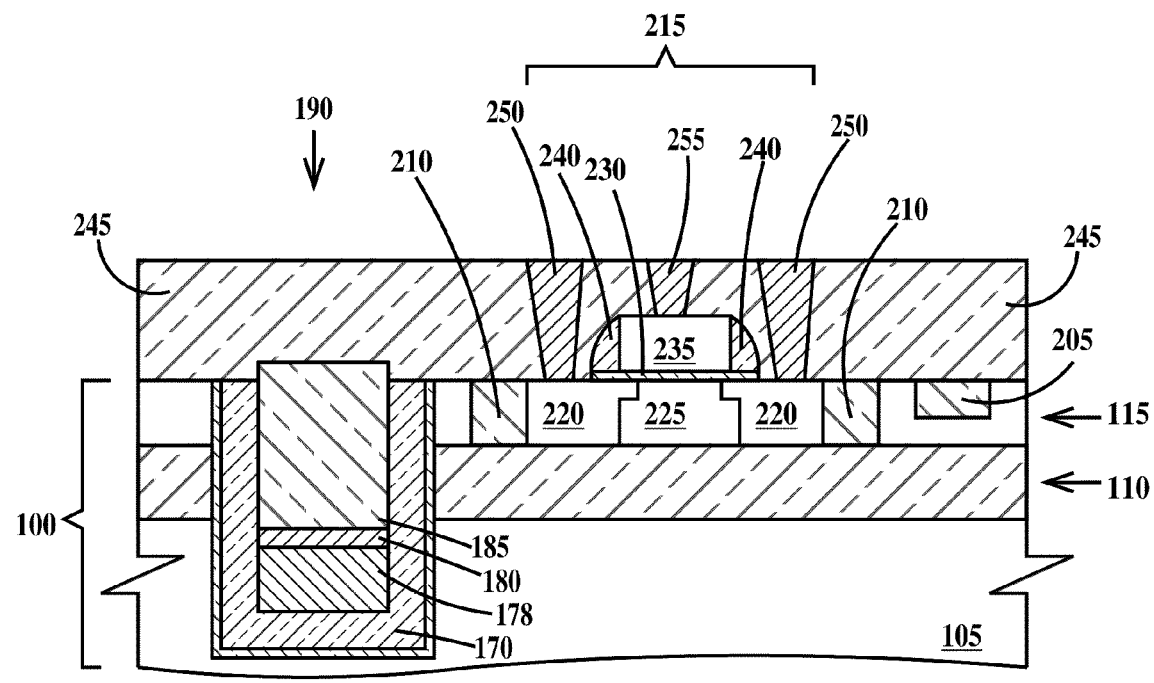

FIGS. 1A through 1P are cross-sectional drawings illustrating fabrication of electron beam alignment target, an optical alignment target and an exemplary field effect transistor (FET) on the same substrate according to embodiments of the present invention. In FIG. 1A, an SOI substrate (or wafer) 100 comprises a body (or handle) 105, a BOX layer 110 on top of the body and a silicon layer 115 on top of the BOX layer. BOX layer 110 comprises silicon dioxide. In one example body 105 is single-crystal silicon. In one example, silicon layer 115 is single crystal silicon. In one method, SOI wafers are formed by ion implantation of oxygen into a single-crystal silicon wafer and annealing to form a buried silicon dioxide layer. In another method, SOI wafers are formed by oxidizing the top surfaces of two silicon wafers, placing the oxidized surfaces in contact, annealing to bond the wafers together, and then removing silicon, for example, by chemical mechanical polish CMP) from the bottom of one of the wafers.

Formed on a top surface of silicon layer 115 is a first layer 120. Formed on a top surface of first pad layer 120 is a second pad layer 125. Formed on a top surface of second pad layer 125 is a hardmask layer 130. In one example first pad layer 120 is silicon dioxide. In one example, second pad layer 125 is silicon nitride. In one example, hardmask layer 130 is silicon dioxide. In one example, BOX layer 110 is from about 50 nm to about 300 nm thick. In one example, silicon layer 115 is from about 30 nm to about 200 nm thick. In one example, first pad layer 120 is from about 2 nm to about 20 nm thick. In one example, second pad layer 125 is from about 5 nm to about 150 nm thick. In one example, hardmask layer 130 is from about 50 nm to about 145 nm thick. In FIG. 1B, a patterned photoresist layer 135 is formed on a top surface of the hardmask layer 130 and an opening 140 is photolithographically formed in the photoresist layer to expose a region of the hardmask layer in the bottom of the opening. This photolithography step defines locations and horizontal geometries of electron beam alignment targets that will be subsequently formed.

In FIG. 1C, hardmask layer 125 is etched using patterned photoresist layer 135 (see FIG. 1B) to form an opening 145 in the hardmask layer and the photoresist layer removed. Alternatively, any photoresist layer 135 remaining after etching hardmask layer 145 may be left in place to either be completely consumed by the operations described infra with respect to FIG. 1D or any remaining photoresist layer removed after those operations. A region of second pad layer 130 is exposed in the bottom of opening 145.

In FIG. 1D, a trench 150 is formed by etching through second pad layer 120, first pad layer 120, silicon layer 115, BOX layer 110 and into body 105. In the example that first pad layer 120 and BOX layer 110 are silicon diodoxide and second pad layer 125 is silicon nitride, two exemplary methods of etching trench 150 will be given. In a first method, a reactive ion etch (RIE) using $CF_4$ as a reactant gas is used to etch trench 150 in one step. In a second method, four steps are used. In a first step, an RIE using $CHF_3$ as a reactant gas is used to etch through second pad layer 125 and first pad layer 120. In a second step an RIE using HBr as a reactant gas is used to etch through silicon layer 115. In a third step, an RIE using $CHF_3$ as a reactant gas is used to etch through BOX layer 110. In a fourth step, an RIE using HBr as a reactant gas is used to etch into body 105. As illustrated in FIG. 1D, all of hardmask layer 130 (see FIG. 1C) is removed and most of second pad layer 120 is removed during the etching of trench 150. However, at one extreme example, a layer of hardmask layer 130 and all first and second pad layers 115 and 120 may remain after etching trench 150 and at an opposite extreme example, at least a layer of first pad layer 120 should remain to protect the top surface of silicon layer 115 from attack during the etching of trench 150. As mentioned supra, any remaining photoresist layer 135 (see FIG. 1C) is removed at this point.

In FIG. 1E, any remaining hardmask layer (see FIG. 1C) and first and second pad layers 120 and 125 (see FIG. 1D) are removed, (e.g. by wet etching or a combination of wet etching and RIE). Trench 150 extends a depth D1 from top surface 160 of silicon layer 115 and has horizontal geometry having a minimum width in at least one horizontal direction of W1. In one example W1 is from about 100 nm to about 10 microns and D1 is about 500 nm to about 5 microns.

In FIG. 1F, a trench liner is formed. The trench liner comprises a first layer 165 formed on all exposed surface of silicon layer 115 and all exposed surfaces of trench 150 and a second layer 170 formed on all exposed surfaces of first layer 165. The trench liner may comprise any number of individual layers. In one example first layer 165 is silicon dioxide. In one example, second layer 170 is silicon nitride. In one example, first layer 165 is from about 2 nm to about 20 nm thick. In one example, second layer 170 is from about 5 nm to about 150 nm thick. In FIG. 1G, a layer of a high-atomic weight (Z) material 175 is deposited over second pad layer 170, filling (as illustrated) or partly filling trench 150. In one example, a high-Z material is a material having an atomic weight greater that that of silicon (about 28 amu) with materials having an atomic weight of about 40 or greater preferred. In one example, material 175 is a metal. In one example, material 175 is advantageously tungsten germanium. In one example, material 175 is advantageously tungsten, which may be formed by chemical vapor deposition (CVD). In FIG. 1H, a CMP is performed, which consumes all or some of first layer 165 and 170. In FIG, 1H, some of layer 170 remains and all of second layer 170.

In FIG. 1I, material 175 (see FIG. 1H) is recessed below the top of trench 150 to a thickness T1 to form an electron back-scattering layer 178. In one example, electron back-scattering layer 178 is recessed below the level of BOX layer 110 (when an SOI substrate is used). If electron back-scattering layer 178 is tungsten, the recess may be performed using a RIE process or a wet etch process (e.g. hydrogen peroxide). In one example T1 is between about 200 nm and about 1 micron.

In FIG. 1J, an optional stress relief layer 180 is formed over electron back-scattering layer 178 in trench 150. In one example, when electron back-scattering layer 178 is tungsten (or another metal) stress relief layer 180 is tungsten silicide (or a metal silicide). Silicides may be formed by deposition of a layer of silicon (e.g. amorphous silicon or polysilicon) followed by a high temperature anneal (vary based on the metal, examples are about 400° C. for NiSi, about 400° C. for CoSi to about 700° C. for WSi), followed by a wet etch to remove unreacted tungsten (or metal). It is advantageous to use a metal for electron back-scattering layer 178 and a silicide for capping layer 180 to reduce stress between electron back-scattering layer 178 and capping layer 185 described infra.

In FIG. 1K, a capping layer 185 is formed, filling trench 150. In one example, capping layer 185 is a dielectric material. In one example, capping layer 185 is silicon dioxide, which may be formed by CVD or plasmas enhanced CVD, or is a TEOS oxide.

In FIG. 1L, a CMP is performed to remove excess capping layer to form an electron beam alignment target 190. Next a cleaning is performed to remove contaminants, particularly any metal contaminants. In one example, a sulfuric acid/nitric acid clean/water rinse followed by a hydrochloric acid clean/water rinse is performed.

In FIG. 1M, any remaining first and second layers 165 and 170 are removed (e. g. by hot phosphoric etch and hydrofluoric acid based etchants (when first and second layers 165 and 170 are respectively silicon nitride and silicon oxide.

In FIG. 1N, a new first pad layer 195 is formed over silicon layer 115 and electron beam alignment target 190 and a new second pad layer 200 is formed over first pad layer 195. In one example first pad layer 195 is silicon dioxide. In one example, second layer 200 is silicon nitride. In one example, first pad layer 195 is from about 2 nm to about 20 nm thick. In one example, second pad layer 200 is from about 5 nm to about 150 nm thick.

Electron-beam alignment target 190 backscatters electrons from electron back-scattering layer 178. Electron beam-alignment target 190, presents a large atomic weight and thus electron backscatter contrast in SEM mode versus the normal silicon and silicon based films used the early processing (e.g. front end of line, FEOL) of integrated circuit chips.

An optical alignment target may be formed at this point as illustrated in FIG. 1O, or be formed simultaneously with the first optically defined fabrication level. In one example, the first optically defined fabrication level is a dielectric filled trench isolation level as illustrated in FIG. 1P.

In FIG. 1O, an optical alignment target 205 is formed in silicon layer 115 by a photolithographic process which includes applying a photoresist layer, exposing the photoresist layer through a photomask aligned to electron beam alignment target 190, developing the exposed photoresist layer to pattern the photoresist followed by etching through first and second pad layers 195 and 200 into silicon layer 115 (not shown in FIG. 1O, see FIG. 1O), followed by removal of the photoresist layer. In one example, when second pad layer 200 is silicon nitride a RIE using $CHF_3$ as the reactant gas may be used to etch the second pad layer. In one example, when first pad layer 195 is silicon dioxide a RIE using $CHF_3$ as the reactant gas may be used to etch the first pad layer. In one example, a RIE using HBr as the reactant gas may be used to etch into silicon layer 115. First and second pad layers 195 and 200 protect electron beam alignment target 190 from subsequent processing steps.

Optical alignment target 205 extends a depth D2 from top surface 160 of silicon layer 115 and has horizontal geometry having a maximum width in at least one horizontal direction of W2. In one example W2 is from about 100 nm to about 5000 nm and D2 is from about 10 nm to about 500 nm. In the example illustrated in FIG. 1O, D2 may be equal to but not greater than the thickness of silicon layer 110. In a first example, optical alignment target 205 extends into silicon layer 115 but does not contact BOX layer 110. In a second example, optical alignment target 205 extends into silicon layer 115 and contacts BOX layer 110. Electron beam alignment target 175 may be the about the same size, bigger, or smaller (in terms of surface area) than optical alignment target 205.

In FIG. 1P, shallow trench isolation (STI) 210 is formed simultaneously with optical alignment target 205 (through first and second pad layers 195 and 200, see FIG. 1O, which are subsequently removed) and silicon layer 115 down to BOX layer 110. In one example, first regions of the STI structure may be formed by a photolithographic process aligned to electron beam alignment target 190 and second regions of the STI may be formed by an electron beam lithographic process aligned to electron beam alignment target 190. Both lithographic processes include lithographically defining an STI pattern in a resist, etching trenches through first and second pad layers 195 and 200 (see FIG. 1O) and silicon layer 115, removing the resist layer depositing an insulator to overfill the trenches and then performing a CMP. The trench insulator is also deposited in optical alignment target 205. In one example, the trench insulator is CVD oxide. In one example the trench insulator is tetraethoxysilane (TEOS) oxide. With an SOI substrate, STI 210 extends down to physically contact BOX layer 110. In the case of a bulk silicon substrate, STI 210 extends a designed distance into the bulk silicon substrate Also in FIG. 1P, an FET 215 comprising source/drains 220 on opposite side of a channel region 225, a gate electrode 235 separated from the channel region by a gate dielectric 230, and optional spacers 240 are formed. Then an interlevel dielectric layer 245 is formed and electrically conductive source/drain contacts 250 and an electrically conductive gate electrode contact 255 are formed in the interlevel dielectric layer. In one example contacts 250 and 255 are formed by a damascene process.

A damascene process is one in which wire trenches, via or contact openings are formed in a dielectric layer, an electrical conductor of sufficient thickness to fill the trenches is deposited on a top surface of the dielectric, and a CMP process is performed to remove excess conductor and make the surface of the conductor co-planar with the surface of the dielectric layer to form damascene wires, vias or contacts.

Generally, additional dielectric layers containing electrically conductive wires and vias are formed over dielectric layer 245 in order to wire individual semiconductor devices into an integrated circuit.

In the fabrication of FET 215, certain features of the FET and contacts may be formed in electron beam lithographic steps using electron beam alignment target 190 and certain features of the FET and contacts may be formed in photolithographic steps using optical alignment target 205. All electron beam lithography steps use electron beam alignment target 190. Most commonly, photolithographic steps use optical alignment target 205 or other subsequently formed optical targets formed after optical alignment target 205 is formed. These subsequently formed optical alignment targets may be aligned to either electron beam alignment target 190, optical alignment target 205, or other optical alignment targets that have been aligned to optical alignment target 205. FET 215 is not to scale relative to electron beam alignment target 190 or optical alignment target 205.

FET 215 should be considered exemplary of devices that may be formed in/on substrate 100 which include, but is not limited to diodes, bipolar transistors, SiGe transistors, other hetero-junction transistors, resistors, capacitors and inductors. It should also be understood that there are many lithographic fabrication steps required to produce semiconductor devices and there are many lithographic fabrication steps required to interconnect these devices into integrated circuits and that all these lithographic steps are aligned to either electron beam alignment target 190, optical alignment target 205 or both as described infra in reference to FIG. 3.

Figure 2:
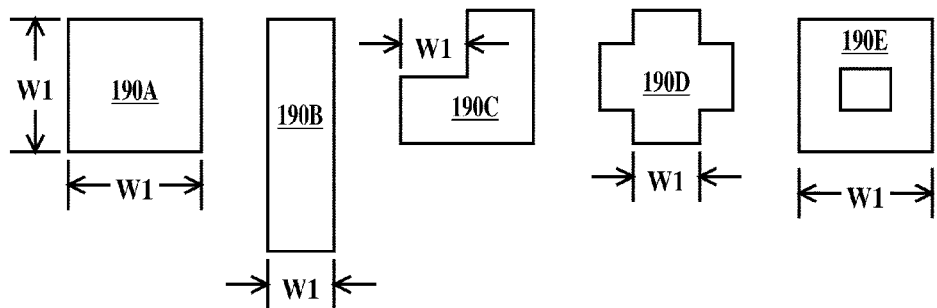
FIG. 2 illustrates various geometric shapes that electron beam alignment targets according to the embodiments of the present invention may take.

FIG. 2 illustrates various geometric shapes that electron beam alignment targets according to the embodiments of the present invention may take. In FIG. 2, exemplary horizontal geometries (i.e. top views, plan views) electron beam alignment targets are illustrated. Electron beam alignment target 190A is square with each side having a length W1. Electron beam alignment target 190B is rectangular with the shortest side having a length W1. Electron beam alignment target 190C is "L" shaped with the "foot" of the "L" having a length W1. Electron beam alignment target 190D is cross-shaped with each arm of the cross having a width W1. Electron beam alignment target 190E is a square ring with each outer side having a length W1.

Currently, the largest optical field size is about 20 mm by about 20 mm and the largest electron beam field size that may be printed is about 0.3 mm by about 0.3 mm. In the example of a single integrated circuit chip of about 10 mm by about 10 mm, there is only one optical exposure field required and about 1200 corresponding electron beam exposure fields. In many cases, when the optical exposure field is sufficiently greater than the chip size, multiple chips are printed at the same time in the same optical exposure field.

Currently, the smallest pitch of patterns printable by photolithography is about 200 nm and the smallest pitch of patterns printable by electron beam lithography is about 70 nm. Thus on levels containing even a small number of features having a pitch less than 200 nm, electron beam lithography must be used. It is advantageous for fabrication levels that contain patterns pitches printable with photolithography as well as patterns not printable with photolithography but printable with electron beam lithography, to print the regions printable with photolithography with photolithographic processes and to print the regions not-printable with photolithography with electron beam lithographic processes rather than printing the entire fabrication level with electron beam lithography.

Figure 3:
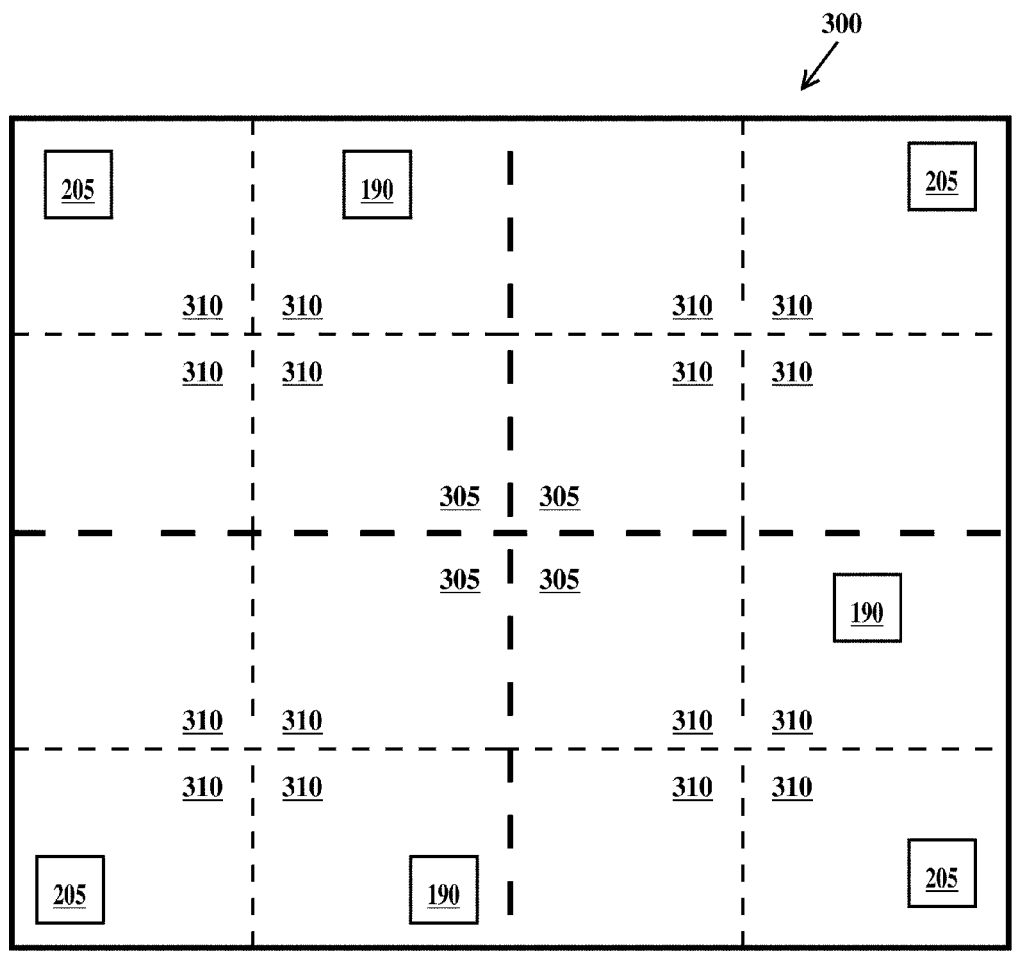
FIG. 3 is a top view of an exemplary integrated circuit chip illustrated the spatial relationships between optical and electron beam exposure fields and optical and electron beam alignment targets according to the embodiments of the present invention.

FIG. 3 is a top view of an exemplary integrated circuit chip illustrated the horizontal spatial relationships between optical and electron beam exposure fields and optical and electron beam alignment targets according to the embodiments of the present invention. In FIG. 3, an exposure field 300 is divided into multiple (e.g. four in FIG. 3) integrated circuit chips each containing an optical alignment target 205. Each integrated circuit chip 305 is virtually divided into multiple (e.g. four in FIG. 3) electron beam exposure fields 310. However, not each electron beam exposure field 310 includes an electron beam alignment target 190, only selected electron beam exposure fields.

Only those electron beam exposure fields in which an electron beam lithography process will be performed contain electron beam alignment targets 190. In the regions without electron beam alignment targets 190, only photolithographic processes will be performed. However, it should be understood that photolithographic processes may be performed in electron beam exposure field that contain electron beam alignment targets 155.

The top view of integrated circuits 305 in FIG. 3 are also known as a floor plan views, floor plan designs or floor plan layouts of integrated circuits 305, and electron beam alignment targets 190, optical alignment targets 175 and all integrated circuit structures and features (not shown in FIG. 3) of all fabrication levels of integrated circuits 305 are positioned in locations relative to a locations of electron beam alignment targets 190 (and thus to optical alignment targets 175 and each other) and have coordinates on a set of X-Y coordinates mapped on the floor plan.

It should be noted, that every electron beam exposure field 310 containing an electron beam alignment target 190 does not have to be printed with electron beam lithography, only those having pattern pitches not printable with photolithography. However, all electron beam alignment targets 190 that will be used at fabrication different levels are all fabricated together at the very beginning of the fabrication process as describe supra. Examples of fabrication levels on an integrated circuit that may contain regions that electron beam lithography would be used for include, but is not limited to STI levels (because silicon regions are defined as well as STI regions), gate electrode levels of FETs, emitter levels of bipolar transistors, contact levels (the interconnection level between devices and the first true wiring level) and the first wiring level.

Figure 4:
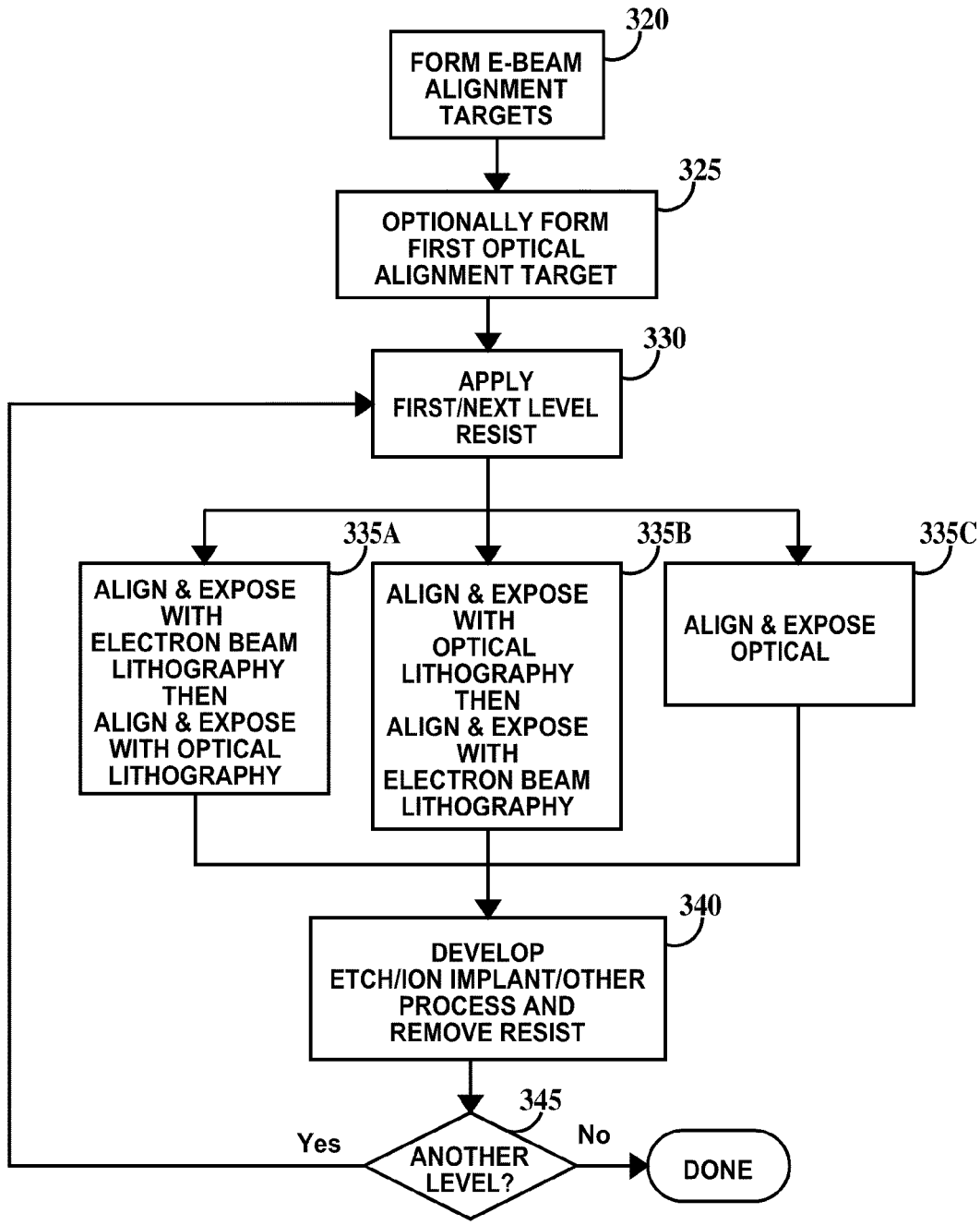
FIG. 4 is a flowchart for fabrication of an integrated circuit using both optical and electron beam lithography according to the embodiments of the present invention.

FIG. 4 is a flowchart for fabrication of an integrated circuit using both optical and electron beam lithography according to the embodiments of the present invention. In step 320, electron beam alignment targets are formed in a semiconductor substrate in all regions of an integrated circuit chip that are to be processed with electron beam lithography at any lithographically defined fabrication level.

In step 325, a first optical alignment target is optionally formed in the substrate aligned to the electron beam alignment target. If an optical alignment target is not formed in step 320, then the first time through any of steps 335A, 335B or 335C an optical alignment target is formed aligned to the electron beam alignment target along with the first lithography level integrated circuit images.

Next in step 330, a resist layer is applied to the substrate. The method them proceeds to either of steps 335A, 335B or 335C. If the method proceeds to step 335A or 335B a dual-exposure resist (i.e. a resist that is exposable by electron beam or light) is used. If the method proceeds to step 335C then either a dual-exposure resist is used or a photoresist (i.e. a light exposable resist).

In step 335A, an electron beam lithographic exposure is performed using the electron beam alignment target followed by a photolithographic exposure using an optical alignment target previously formed or using the electron beam alignment target. The method then proceeds to step 340.

In step 335B, a photolithographic exposure using an optical alignment target previously formed or using the electron beam alignment target followed by an electron beam lithographic exposure performed using the electron beam alignment target. The method then proceeds to step 340.

In step 335C, a photolithographic exposure is performed using an optical alignment target previously formed or using the electron beam alignment target. The method then proceeds to step 340.

In step 340, the resist is exposed and developed, etching, ion implantation or other processing is performed and the resist is removed. If this is the first lithographically defined fabrication level of the integrated circuit chip (e.g. the level STI is defined at) and if the first optical alignment target has not yet been formed, then step 340 defines the first optical alignment target in the substrate. If the first optical alignment target is fabricated in step 345 it may be defined by either electron beam lithography or photolithography.

In step 345 it is determined if another lithographically defined fabrication level is required. If another fabrication level is required the method loops back to step 330, otherwise the method as to lithographically defined fabrication levels of an integrated circuit chip is done.

Instead if exposing a single layer of resist optically and with an electron beam, a two "resist" process on the same fabrication level may be performed. In a first example, an electron beam lithographic process is performed using an electron beam resist and an electron beam alignment target, the electron beam resist developed, and the pattern in the electron beam resist transferred into the substrate or layer on the substrate. Then, a photolithographic process is performed using photoresist and an electron beam alignment target or an optical alignment target, the photoresist developed, and the pattern in photoresist transferred into the same substrate or layer on the substrate. In a second example, a photolithographic process is performed using photoresist and an electron beam alignment target or an optical alignment target, the photoresist developed, and the pattern in photoresist transferred into the substrate or layer on the substrate. Then an electron beam lithographic process is performed using an electron beam resist and an electron beam alignment target, the electron beam resist developed, and the pattern in the electron beam resist transferred into the same substrate or layer on the substrate.

Thus, the embodiments of the present invention provide an alignment target and method for co-alignment of optical and electron beam lithographic fabrication levels.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a first trench in a semiconductor substrate, said first trench extending from a top surface of said substrate into said substrate a first distance;
an electron back-scattering layer in a bottom region of said first trench;
a dielectric capping layer in said first trench and on a top surface of said back-scattering layer, an entire bottom surface of said capping layer coextensive with the entire top surface of said electron back-scattering layer; and
a second trench in said substrate, said second trench extending from said top surface of said substrate into said substrate a second distance, said second distance less than said first distance, said second trench completely filled with different layers than said first trench, said second trench filled only with dielectric materials.

2. The structure of claim 1, wherein said electron back-scattering layer comprises a material having a Z of 40 or greater.

3. The structure of claim 1, wherein said electron backscattering layer comprises a metal.

4. The structure of claim 1, further including:
a dielectric liner formed on sidewalls and a bottom of said first trench.

5. The structure of claim 1, further including:
said substrate comprising a buried oxide layer between a silicon layer and a body, a top surface of said silicon layer being a top surface of said substrate; and
said first trench extending through said silicon layer, through said buried oxide layer and into said body, said first trench electrically isolated from said body.

6. The structure of claim 5, wherein a top surface of said electron back-scattering layer is below a bottom surface of said buried oxide layer.

7. The structure of claim 5, wherein said second trench extends to said buried oxide layer.

8. The structure of claim 5, wherein:
said second trench does not extend to said buried oxide layer.

9. The structure of claim 1, wherein said electron backscattering layer comprises tungsten.

10. The structure of claim 1, further including:
a first dielectric liner formed on sidewalls and a bottom of said first trench; said first dielectric liner comprising a first single continuous layer; and
a second dielectric liner formed on said first dielectric liner; said second dielectric liner comprising a single continuous layer, said electron-back scattering layer abutting a lower region of said second dielectric liner and said dielectric capping layer abutting an upper region of said second dielectric liner.

11. The structure of claim 1, wherein said dielectric capping layer extends above a top surface of said semiconductor substrate.

12. The structure of claim 1, further including:
trench isolation in said substrate filled with a single insulating layer; and
said second trench completely filled with said single insulating layer.

13. The structure of claim 1, further including:
a dielectric liner formed on sidewalls and a bottom of said first trench; said dielectric liner comprising a single continuous layer, said electron-back scattering layer abutting a lower region of said dielectric liner and said dielectric capping layer abutting an upper region of said dielectric liner.

14. A structure, comprising:
a first trench in a semiconductor substrate, said first trench extending from a top surface of said substrate into said substrate a first distance;
an electron back-scattering layer in a bottom region of said first trench;
a stress reduction layer in said first trench and on a top surface of said electron backscattering layer; an entire bottom surface of said stress reduction layer coextensive with the entire top surface of said electron back-scattering layer;
a dielectric capping layer in said first trench and on a top surface of said stress reduction layer, an entire bottom surface of said capping layer coextensive with the entire top surface of said stress reduction layer; and
a second trench in said substrate, said second trench extending from said top surface of said substrate into said substrate a second distance, said second distance less than said first distance.

15. The structure of claim 14, wherein said electron back-scattering layer comprises a material having a Z of 40 or greater.

16. The structure of claim 14, wherein said electron back-scattering layer comprises a metal.

17. The structure of claim 14, wherein and said stress reduction layer comprises a metal silicide.

18. The structure of claim 14, further including:
a dielectric liner formed on sidewalls and a bottom of said first trench.

19. The structure of claim 14, further including:
said substrate comprising a buried oxide layer between a silicon layer and a body, a top surface of said silicon layer being a top surface of said substrate; and
said first trench extending through said silicon layer, through said buried oxide layer and into said body.

20. The structure of claim 19, wherein a top surface of said electron back-scattering layer is below a bottom surface of said buried oxide layer.

21. The structure of claim 19, wherein a top surface of said electron back-scattering layer is below a bottom surface of said buried oxide layer.

22. The structure of claim 19, wherein said second trench extends to said buried oxide layer.

23. The structure of claim 19, wherein:
said second trench does not extend to said buried oxide layer.

24. The structure of claim 14, wherein said electron back-scattering layer comprises tungsten.

25. The structure of claim 14, further including:
a dielectric liner formed on sidewalls and a bottom of said first trench; said dielectric liner comprising a single continuous layer, said electron-back scattering layer abutting a lower region of said dielectric liner, said stress reduction layer abutting a middle region of said dielectric liner and said dielectric capping layer abutting an upper region of said dielectric liner.

26. The structure of claim 14, further including:
a first dielectric liner formed on sidewalls and a bottom of said first trench; said first dielectric liner comprising a first single continuous layer; and
a second dielectric liner formed on sidewalls and a bottom of said first trench; said second dielectric liner comprising a single continuous layer, said electron-back scattering layer abutting a lower region of said second dielectric liner, said stress reduction layer abutting a middle region of said second dielectric liner and said dielectric capping layer abutting an upper region of said second dielectric liner.

27. The structure of claim 14, wherein said dielectric capping layer extends above a top surface of said semiconductor substrate.

28. The structure of claim 14, further including:
trench isolation in said substrate filled with an insulating layer; and
said second trench filled with said insulating layer.

29. The structure of claim 1, wherein said electron back-scattering layer is formed from a material having a higher atomic weight than that of silicon.

30. The structure of claim 14, wherein said electron back-scattering layer is formed from a material having a higher atomic weight than that of silicon.

* * * * *